United States Patent [19]
Lin

[11] Patent Number: 4,588,946
[45] Date of Patent: May 13, 1986

[54] METHOD FOR MEASURING CURRENT AT A P-N JUNCTION

[75] Inventor: Paul S. Lin, Berkeley Heights, N.J.

[73] Assignee: AT&T Bell Laboratories, Murray Hill, N.J.

[21] Appl. No.: 567,349

[22] Filed: Dec. 30, 1983

[51] Int. Cl.4 ...................... G01R 31/26; G01R 19/08
[52] U.S. Cl. ............................ 324/158 D; 324/158 R
[58] Field of Search ........................ 324/158 R, 158 D; 250/310

[56] References Cited

PUBLICATIONS

Balk, L., et al., "Microcharacterization of Electroluminescent Diodes with the Scanning Electron Microscope (SEM)", Proc. of the S.I.D. vol. 16/2, 2nd qtr. 1975, pp. 119-124.

Parsons, R., et al., "Differentiated Electron-Beam-Induced-Current (DEBIC) Quantitative Characterization of Semiconductor Heterostructure Lasers", J. Appl. Phys. vol. 50, No. 1, Jan. 1979, pp. 538-540.

Leamy, H., "Charge Collection Scanning Electron Microscopy", J. Appl. Phys. vol. 53, No. 6, Jun. 1982, pp. R51-R80.

*Primary Examiner*—Stewart J. Levy
*Assistant Examiner*—Stephen M. Baker
*Attorney, Agent, or Firm*—Richard D. Laumann

[57] ABSTRACT

A method of mapping the current distribution of a p-n junction is described. The method uses measurements of the electron beam induced current.

5 Claims, No Drawings

METHOD FOR MEASURING CURRENT AT A P-N JUNCTION

TECHNICAL FIELD

This invention relates generally to semiconductor devices and particularly to a method for measuring the current distribution at a p-n junction.

BACKGROUND OF THE INVENTION

There are many parameters that characterize semiconductor materials and devices. For example, semiconductor materials are characterized by parameters such as the energy bandgap, the carrier mobilities, and the carrier effective masses. Semiconductor devices having, for example, a p-n junction, are characterized by parameters such as the depletion region width and capacitance as well as current-voltage characteristics. Accordingly, techniques for measuring these parameters are of interest and have been devised.

One area of interest for semiconductor devices is the measurement of the current-voltage characteristics at a p-n junction. This is of special interest for laser diodes for which the forward current determines the light output. For several reasons, for example, reduction of cross-section area to reduce operating current, improved reliability by removing the junction perimeter from the surface, and elimination of multifilament lasing, it is desirable to fabricate lasers having a narrow active region. In such lasers, the active region is in the form of a stripe. Measurements that would permit mapping of the current distribution for a p-n junction would be desirable as they would enable the amount of current confinement to be ascertained. However, it has hitherto been difficult to map the forward current distribution for p-n junctions in semiconductor laser diodes.

SUMMARY OF THE INVENTION

I have found that the current distribution at a p-n junction may be mapped by scanning a beam of radiation, such as an electron beam, over the p-n junction and measuring the electron beam induced current (EBIC). This permits the electrostatic potential difference across the junction to be determined and the Shockley relation is then used to determine the current distribution.

DETAILED DESCRIPTION

The semiconductor device containing a p-n junction is mounted in a suitable and well-known manner for exposure to a scanning beam of radiation such as an electron beam. Electrical contacts are also made to the device, in well-known manner, so that it may be appropriately biased and the current measured. The type of device is not critical and it may be, for example, a p-n junction solar cell, a light-emitting diode, a laser diode, as well as other devices which contain a p-n junction. The details of such a radiation beam including its construction and operation are well known to those skilled in the art and need not be further described.

The beam comprises radiation which is absorbed in the semiconductor to produce electron-hole pairs. The radiation may comprise electromagnetic radiation, i.e., light, or electrons. However, electrons are the preferred form of radiation as an electron beam is more easily focussed to a small spot than is a light beam. This permits mapping of the current distribution with greater spatial resolution. Futhermore, less radiation is lost by reflection with an electron beam than with a light beam. Additionally, the electron beam has the significant practical advantage of being more easily scanned than is a light beam.

Some of the electrons from the beam will be absorbed in the device and electron-hole pairs produced. The resulting current, I, that is, the electron beam induced current (EBIC) is measured in a manner which is well known to those skilled in the art. As will be apparent from the following discussion, my method permits, for example, the forward current density at a p-n junction to be measured and mapped for the junction. This is a useful technique for many types of semiconductor devices, such as laser diodes, in which the leakage current is often a critical design parameter and accurate measurement is desirable to facilitate design and manufacture.

After the induced current, I, is measured, the junction forward current density, J, may be deduced as follows. Knowledge of the current as a function of beam position permits the current density to be mapped for the p-n junction. The EBIC signal current, I, at the junction, is used to measure the electrostatic potential difference, V, across the junction. The potential difference, V, in turn determines J via the well-known Shockley relation:

$$J = J_s\left(\exp\left(\frac{qV}{kT}\right) - 1\right) \quad (1)$$

where $J_s$ is the reverse saturation current, k is the Boltzmann constant, T is the absolute temperature, and V is the electrostatic potential across the junction:

$$V = V_{bi} + V_{app} \quad (2)$$

where $V_{bi}$ is the built-in potential at the junction and $V_{app}$ is applied potential across the junction. The electron beam induced current signal, I, is given by:

$$I = I_0[\exp(-\bar{x}/l_e) + \exp(-\bar{x}/l_h)]\left[1 - \exp\left(-\frac{(V-E)q}{kT}\right)\right] + I_1 W \quad (3)$$

where $I_0$ is a proportionality constant, $\bar{x}$ is the average distance of electron beam induced carriers from the edge of the junction, $l_e$ and $l_h$ are the mean diffusion lengths of electrons and holes, respectively, V is the potential difference across the junction, E is the mean kinetic energy of the electron beam induced carriers, $I_1$ is also a proportionality constant, and W is the width of the depletion layer. These parameters may be readily determined for materials and devices of interest by those skilled in the art.

From equation (3), V can be determined from I. Therefore, according to equation (1), J can be easily determined and mapped for a p-n junction.

Equations (1) and (3) contain proportionality constants which may be determined, if desired. However, for some applications, only the relative magnitudes of the current densities need be determined and not the absolute value of the current densities. For such applications, the values of the proportionality constants need not be determined.

It will be readily appreciated that although my invention can be practiced with present devices, such as scanning electron microscopes, an electronic module or device can be designed and manufactured whose primary function is current mapping using the method of my invention.

What is claimed is :

1. A method of measuring the current distribution at a p-n junction within a semiconductor device comprising the steps of:
scanning a beam of radiation across the p-n junction;
measuring the current produced by the absorption of said beam of radiation, I;
determining the electrostatic potential difference across the junction; and
using the Shockley relation to determine the device current density, J.

2. A method as recited in claim 1 in which said p-n junction is forward biased.

3. A method as recited in claim 1 in which said beam of radiation comprises an electron beam.

4. A method as recited in claim 3 in which said device comprises a laser diode and said method further comprises ascertaining the leakage current.

5. A method as recited in claim 4 in which said p-n junction is forward biased.

* * * * *